(12) United States Patent
Chen et al.

(10) Patent No.: US 9,645,204 B2
(45) Date of Patent: May 9, 2017

(54) MAGNETIC FIELD SENSORS AND SENSNG CIRCUITS

(71) Applicants: Young-Shying Chen, Hsinchu (TW); Cheng-Tyng Yen, Kaohsiung (TW)

(72) Inventors: Young-Shying Chen, Hsinchu (TW); Cheng-Tyng Yen, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 1072 days.

(21) Appl. No.: 13/722,715

(22) Filed: Dec. 20, 2012

(65) Prior Publication Data

US 2014/0176132 A1 Jun. 26, 2014

(51) Int. Cl.
 *G01R 33/09* (2006.01)
(52) U.S. Cl.
 CPC .................................. *G01R 33/098* (2013.01)
(58) Field of Classification Search
 CPC ..................................................... G01R 33/098
 See application file for complete search history.

(56) References Cited

U.S. PATENT DOCUMENTS

| 7,352,177 | B2 | 4/2008 | Lee et al. |
| 7,532,504 | B2 | 5/2009 | Saito |
| 7,635,974 | B2 | 12/2009 | Guo et al. |
| 7,642,773 | B2 | 1/2010 | Takahashi et al. |
| 2007/0089311 | A1 | 4/2007 | Amundson et al. |
| 2007/0169552 | A1 | 7/2007 | Shoji et al. |
| 2007/0205766 | A1 | 9/2007 | Kou |
| 2007/0290682 | A1 | 12/2007 | Oohira et al. |
| 2008/0272771 | A1* | 11/2008 | Guo ........................ B82Y 25/00 324/260 |

(Continued)

FOREIGN PATENT DOCUMENTS

| CN | 1898574 | 1/2007 |
| CN | 101072022 | 11/2007 |

(Continued)

OTHER PUBLICATIONS

"Office Action of China Counterpart Application", issued on Dec. 25, 2013, p. 1-p. 12.

(Continued)

*Primary Examiner* — Patrick Assouad
*Assistant Examiner* — Haidong Zhang
(74) *Attorney, Agent, or Firm* — Jianq Chyun IP Office

(57) ABSTRACT

A magnetic sensor for sensing an external magnetic field includes first and second electrodes and first and second magnetic tunneling junctions. The first and second electrodes are disposed over a substrate; and the first and second magnetic tunneling junctions are conductively disposed between the first and second electrodes and connected in parallel between the first and second electrodes. The first and second magnetic tunneling junctions are arranged along a first easy axis of the magnetic sensor. The first magnetic tunneling junction includes a first pinned magnetization and a first free magnetization, and the second magnetic tunneling junction includes a second pinned magnetization and a second free magnetization. The first free magnetization and the second free magnetization are arranged substantially in parallel to the first easy axis and in substantially opposite directions.

22 Claims, 10 Drawing Sheets

(56) References Cited

U.S. PATENT DOCUMENTS

| | | | |
|---|---|---|---|
| 2009/0015251 A1 | 1/2009 | Azumi et al. | |
| 2009/0027048 A1 | 1/2009 | Sato et al. | |
| 2009/0243607 A1* | 10/2009 | Mather | B82Y 25/00 |
| | | | 324/249 |
| 2010/0073185 A1 | 3/2010 | Uchiyama et al. | |
| 2011/0244599 A1 | 10/2011 | Whig et al. | |

FOREIGN PATENT DOCUMENTS

| | | |
|---|---|---|
| EP | 2003462 | 12/2008 |
| TW | 200603155 | 1/2006 |

OTHER PUBLICATIONS

Diaz-Michelena, M., "Small Magnetic Sensors for Space Applications", *Sensors 2009*, 9, 2271-2288; Mar. 30, 2009.

Reig C., et al., "Magnetic Field Sensors Based on Giant Magnetoresistance (GMR) Technology: Applications in Electrical Current Sensing", *Sensors 2009*, 9, 7919-7942, Oct. 12, 2009.

Zhang H., "Microfabrication and Test of a Magnetic Field Sensor Using Electrodeposited Thin Film of Giant Magnetoresistive (Cu/Co)$_x$ Multilayers", *Microsystems Technologies*, 9 (2003)Draf, 436-440-, Aug. 3, 2001.

\* cited by examiner

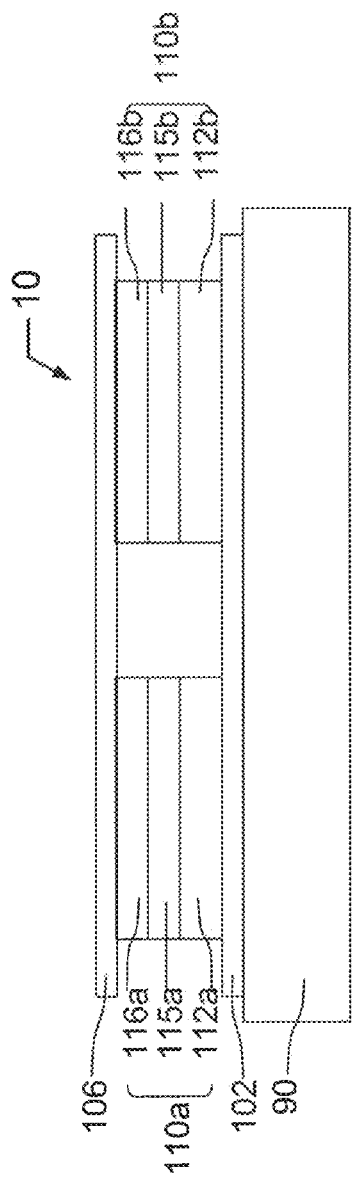
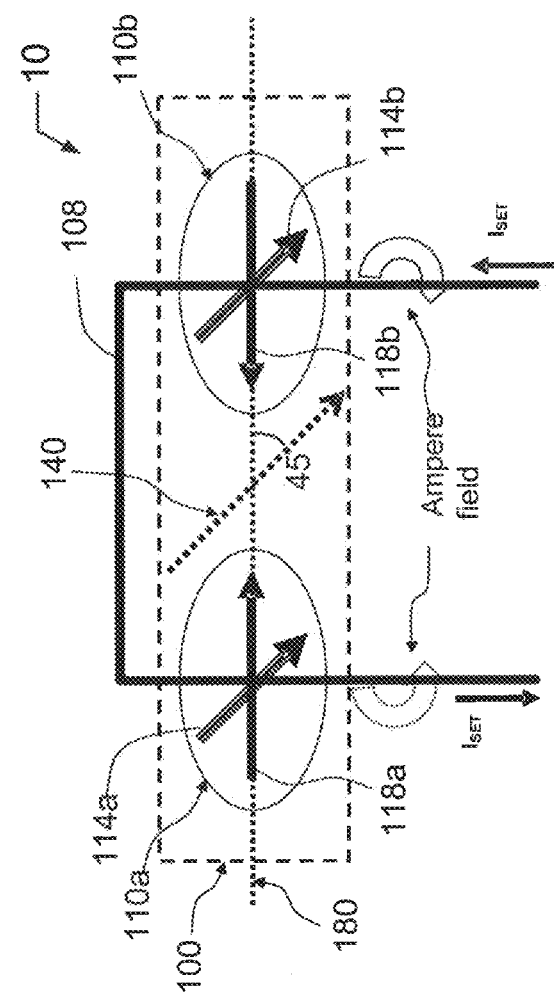
FIG. 1A (cross-sectional view)
FIG. 1B (top view)

MAGNETIC FIELD SENSORS AND SENSNG CIRCUITS

CROSS-REFERENCE TO RELATED APPLICATIONS

This application is a continuation in part of U.S. application Ser. No. 13/097,083, filed on Apr. 29, 2011, which claims the benefit of priority to U.S. Provisional Application No. 61/383,734, filed on Sep. 17, 2010. These applications are hereby incorporated by reference in their entities.

TECHNICAL FIELD

The disclosure relates to a magnetic field sensing apparatus and, more particularly, to three-axis magnetic field sensors.

BACKGROUND

Electronic compasses are integrated in various electronic products to improve navigational performance or other functionalities of those products. For example, an electronic compass can be used in connection with a global positioning system (GPS) to improve position sensing. A traveling direction sensed by the GPS reflects movements of an object carrying the GPS. However, when the object stops or travels at a low speed, conventional GPS often cannot determine the orientation and position of the object. An electronic compass can provide information of a geomagnetic field, thereby improving the position sensing by the GPS.

Hall devices and magneto-resistive devices can usually provide sensing of an external magnetic field. Magneto-resistive devices, including anisotropic magneto-resistor (AMR), giant magneto-resistor (GMR), and tunneling magneto-resistor (TMR), may provide better sensitivity than Hall devices.

Existing magneto-resistive devices may have significant limitations depending on the devices or their configurations, designs, or applications. For example, AMR magnetic field sensors are generally limited to two-axis sensing. GMR magnetic field sensors can only operate in a unipolar mode, because they can detect only the magnitude of the sensed magnetic field but not the exact direction of the field. In addition, it may be difficult to achieve a multi-axis integrated magnetic field sensor using conventional GMR, TMR, or AMR.

SUMMARY

In some embodiments, a magnetic sensor for sensing an external magnetic field is provided. The magnetic sensor comprises: a first electrode and a second electrode disposed over a substrate; a first magnetic tunneling junction and a second magnetic tunneling junction conductively disposed between the first electrode and the second electrode and connected in parallel between the first electrode and the second electrodes. The first magnetic tunneling junction and the second magnetic tunneling junction are arranged along a first easy axis of the magnetic sensor. The first magnetic tunneling junction includes a first pinned layer having a first pinned magnetization, a first free layer having a first free magnetization, and a first tunneling layer between the first pinned layer and the first free layer. The second magnetic tunneling junction includes a second pinned layer having a second pinned magnetization, a second free layer having a second free magnetization, and a second tunneling layer between the second pinned layer and the second free layer. The first free magnetization and the second free magnetization are arranged substantially in parallel to the first easy axis and in substantially opposite directions. The first pinned magnetization and the second pinned magnetization each form an angle of about 45 or 135 degrees with the first easy axis.

In other embodiments, a circuit for sensing an external magnetic field is provided. The circuit comprises: a first voltage source for providing a source voltage; a first magnetic sensor for providing a reference current; a second magnetic sensor for sensing an external magnetic field, a conductivity of the second magnetic sensor varying in response to the external magnetic field; a bias voltage unit connected to the first magnetic sensor and the second magnetic sensor for providing a bias voltage to the first magnetic sensor and the second magnetic sensor; a clamp voltage current mirror unit for generating the reference current of the first magnetic sensor and mirroring the current to the second magnetic sensor; and a signal transfer amplifying unit for generating an output voltage and an additional current to compensate the changes in the conductivity of the second magnetic sensor.

In still other embodiments, a method for forming a magnetic sensor is disclosed. The method comprises: disposing a first magnetic tunneling junction and a second magnetic tunneling junction between a first electrode and a second electrode on a substrate. The first magnetic tunneling junction and the second magnetic tunneling junction are aligned along a first easy axis. The first magnetic tunneling junction includes a first pinned layer and a first free layer, and the second magnetic tunneling junction includes a second pinned layer and a second free layer. The method further comprises connecting the first magnetic tunneling junction and the second magnetic tunneling junction in parallel between the first electrode and the second electrode; setting a first pinned magnetization in the first pinned layer of the first magnetic tunneling junction and a second pinned magnetization in the second pinned layer of the second magnetic tunneling junction along a first pinned direction by subjecting the magnetic sensor to one or more external magnetic fields during an annealing process; and generate ampere fields on the first free layer of the first magnetic tunneling junction and the second free magnetization in the second free layer of the second magnetic tunneling junction by a setting current. The first and second pinned magnetizations each form an angle of about 45 or 135 degrees with the first easy axis. The first and second free magnetizations are parallel to the first easy axis and in substantially opposite directions.

BRIEF DESCRIPTION OF THE DRAWINGS

The accompanying drawings provide further understandings of the disclosed embodiments. The drawings illustrate the disclosed embodiments and, together with the description, serve to explain the disclosed embodiments.

FIGS. 1A and 1B illustrate a cross-sectional view and a top view of a mutual supplement tunneling magneto-resistor (MS-TMR), respectively, consistent with disclosed embodiments.

DETAILED DESCRIPTION

Figure 2A:
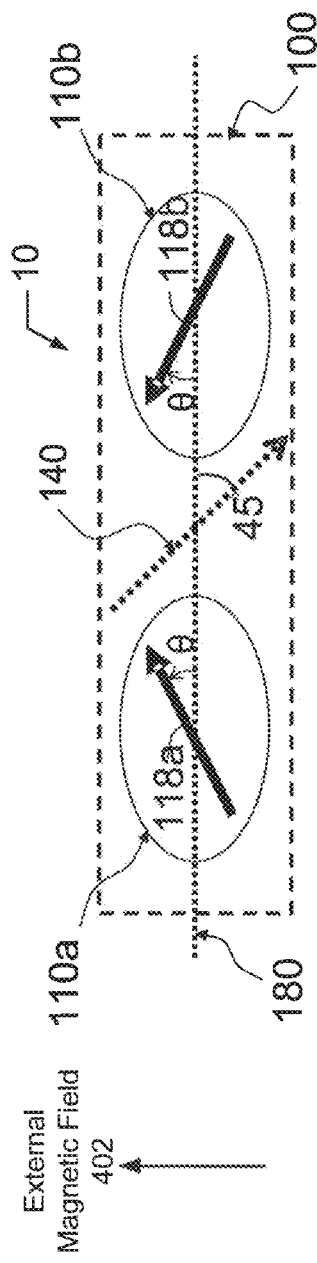
FIG. 2A illustrates another top view of the MS-TMR of FIGS. 1A and 1B.

Reference will now be made in detail to exemplary embodiments, examples of which are illustrated in the accompanying drawings. The following description refers to the accompanying drawings in which the same numbers in different drawings may represent the same or similar elements. The implementations set forth in the following descriptions of exemplary embodiments do not represent all implementations consistent with the disclose embodiments. Instead, they are merely examples of systems and methods consistent with aspects related to the disclose embodiments.

Magnetic sensors comprising one or more mutual supplement tunneling magneto-resistors (MS-TMRs) are provided for sensing an external magnetic field. Methods are also provided for sensing the external magnetic field by using the magnetic sensor. Magnetic sensors disclosed herein may produce a substantially or approximately linear output in response to the external magnetic field. In some embodiments, magnetic sensors may be integrated in electronic circuits for generating electronic signals in response to an external magnetic field.

FIG. 1A illustrates a cross-sectional view of a magnetic sensor 10 including a MS-TMR 100, and FIG. 1B shows a top view of the magnetic sensor 10, consistent with disclosed embodiments. As shown in FIG. 1A, the MS-TMR 100 has a multi-layer structure, including a bottom electrode 102 made of a conductive material, such as Ta, Ti, TiN, TaN, Al, Cu, Ru, etc., and formed on a substrate 90; a top electrode 106 made of a similar conductive material; and a first and a second Magnetic Tunneling Junction (MTJ) devices 110a and 110 b formed between the bottom electrode 102 and the top electrode 106. As such, the first MTJ device 110a and the second MTJ device 110b are connected in parallel between the top electrode 106 and the bottom electrode 102.

As further illustrated in FIGS. 1A and 1B, the first and second MTJ devices 110a and 110b each have an oval shape with substantially same dimensions. The first and second MTJ devices 110a and 110b are oriented such that the major axes of the oval shapes are substantially parallel to an easy axis 180.

Further, the first and second MTJ devices 110a and 110b each have a sandwich structure including two magnetic layers separated by a tunneling layer. The first MTJ device 110a includes a first pinned layer 112a made of a magnetic material, such as NiFe, CoFe, CoFeB, etc., and formed on or over the bottom electrode 102. The first pinned magnetic layer 112a has a first pinned magnetization 114a, as shown in FIG. 1B, substantially parallel to a first pinned direction 140, which may form an angle of about 45 degrees or 135 degrees to the easy axis 180. In some examples, the 45 or 135 degree angle may vary within, for example, a ±3%, ±5%, ±10%, or ±15% range, depending on various factors, such as design specifications, applications of the sensor, manufacturing process, or control process, etc. A first tunneling layer 115a of a non-magnetic material, such as AlO, MgO, etc., may be formed on or over the first pinned layer 112a. A first free magnetic layer 116a made of a similar magnetic material is formed on or over the first tunneling layer 115a and has a first free magnetization 118a substantially parallel to the easy axis 180. The top electrode 106 connects conductively to the first free magnetic layer 116a.

The second MTJ device 110b has a substantially similar structure as the first MTJ devices 110a. The second MTJ device 110b includes a second pinned layer 112b made of a magnetic material similar to that of the first pinned layer 112a and formed on or over the bottom electrode 102. The second pinned layer 112b has a second pinned magnetization 114b that is also substantially parallel to the first pinned direction 140. A second tunneling layer 115b of a non-magnetic material is formed on or over the second pinned layer 112b. A second free magnetic layer 116b of the magnetic material is formed on or over the second tunneling layer 115b and has a second free magnetization 118b that is also initially and substantially parallel to the easy axis 180. The top electrode 106 connects conductively to the second free magnetic layer 116b.

As shown in FIG. 1B, a conductive wire 108 may be arranged to cross the first and second MTJ devices 110a, 110b. In some examples, the conductive wire 108 can be placed in various locations or layers. For example, the conductive wire 108 may be disposed above or below the top electrode 106, or above or below the bottom electrode 102. A set current (or setting current) $I_{SET}$ may flow in the conductive wire 108 to generate ampere fields for the MS-TMR 100. The conductive wire 108 is arranged so that it is substantially perpendicular to the easy axis 180 while crossing the first and second MTJ devices 110a and 110b. The ampere fields at the locations of the first and second MTJ devices 110a and 110b are substantially parallel to the easy axis 180, but are in substantially opposite directions. The ampere fields generated by the set current $I_{SET}$ are used to set the directions of the first and second free magnetizations 118a and 118b, which may be substantially parallel to the easy axis 180 and are in substantially opposite directions. In some examples, in the conductive wire 108, the sections that cross the first and second MTJ devices 110a and 110b may or may not be substantially perpendicular to the easy axis 180.

Although FIG. 1B depicts that the conductive wire 108 forms a U shape, the conductive wire 108 may form a variety of shapes or arranged in other proper forms. In some embodiments, the conductive wire 108 may be integrated with or formed as a part of the top electrode 106 or the bottom electrode 102.

The first and second free magnetizations 118a and 118b are depicted in their initial states, when the MS-TMR 100 is not subject to an external magnetic field. In some embodiments, the set current $I_{SET}$ for generating the ampere fields may be turned on for a period of time and then turned off to set the first and second free magnetizations 118a and 118b to their initial states before MS-TMR 100 is used to sense the external magnetic field. The set current $I_{SET}$ may be supplied by an external circuit known in the art. The value of the set current and the length of the time period required to set the free magnetizations may vary depending on the design of the MS-TMR 100.

The first and second pinned magnetizations 114a and 114b may be set during an annealing process when the MS-TMR 100 is formed. The annealing process is described in greater details below. The MS-TMR 100 is suitable for detecting and measuring an external field, which is substantially perpendicular to the easy axis 180 and substantially parallel to the plane of the MS-TMR 100.

When an external magnetic field is applied to the MS-TMR 100, the orientations of the first and second pinned magnetizations 114a and 114b do not change, while the first and second free magnetizations 118a and 118b may be rotated in the plane of the first and second free magnetic layers 116a and 116b. The conductivity of the MS-TMR 100 between the top electrode 106 and the bottom electrode 102 may depend on the relative angles between the first and second pinned magnetizations 114a and 114b and the first and second free magnetizations 118a and 118b and is described below with reference to FIGS. 2A and 2B.

FIG. 2A illustrates rotations of the first and second free magnetizations 118a and 118b of the MS-MTR 100, when an external magnetic field 402 is applied to the MS-TMR 100, consistent with the disclosed embodiments. The external magnetic field 402 is substantially perpendicular to the easy axis 180 of the first and second MTJ devices 110a and 110b and substantially parallel to the plane of the substrate 90 or the plane of the MS-TMR 100. As a result of the external magnetic field 402, the first free magnetization 118a of the first MTJ device 110a and the second free magnetization 118b of the second MTJ device 110b are rotated by an angle θ counterclockwise and clockwise, respectively, as illustrated in FIG. 2A.

Accordingly, the conductivity $G_{\pi/4}$ of the first MTJ device 110a and the conductivity $G_{3\pi/4}$ of the second MTJ device 110b can be calculated as follows:

$$G_{\pi/4} = \frac{G_P}{2}\left[1 + \frac{1 + MR\cos(\frac{\pi}{4} + \theta)}{1 + MR}\right] \quad (1)$$

$$= \frac{G_P}{2}\left[1 + \frac{1 + \frac{MR}{\sqrt{2}}(\cos\theta - \sin\theta)}{1 + MR}\right],$$

and $$G_{3\pi/4} = \frac{G_P}{2}\left[1 + \frac{1 + MR\cos\left(\frac{3\pi}{4} + \theta\right)}{1 + MR}\right] \quad (2)$$

$$= \frac{G_P}{2}\left[1 + \frac{1 + \frac{MR}{\sqrt{2}}(-\cos\theta - \sin\theta)}{1 + MR}\right],$$

where θ is the rotation angle of the first free magnetization 118a and the second free magnetization 118b when the external magnetic field 402 is applied, MR represents the magneto-resistance ratio of the first MTJ device 110a and the second MTJ device 110b, which are substantially identical, $G_p$ is the conductivity of the first and second MTJ devices 100a and 100b when the first and second free magnetizations 118a and 118b are substantially parallel to the first and second pinned magnetizations 114a and 114b.

The conductivity of the MS-TMR 100 is the result of the first and second MTJ devices 110a and 110b connected or coupled in parallel between the top and bottom electrodes 106 and 102. Accordingly, the conductivity of the MS-TMR 100, when the external magnetic field 402 is applied, can be calculated as follows:

$$G = G_{\pi/4} + G_{3\pi/4} \quad (3)$$

$$= G_P\left[1 + \frac{1 - \frac{MR}{\sqrt{2}} \times \sin\theta}{1 + MR}\right].$$

Figure 2B:
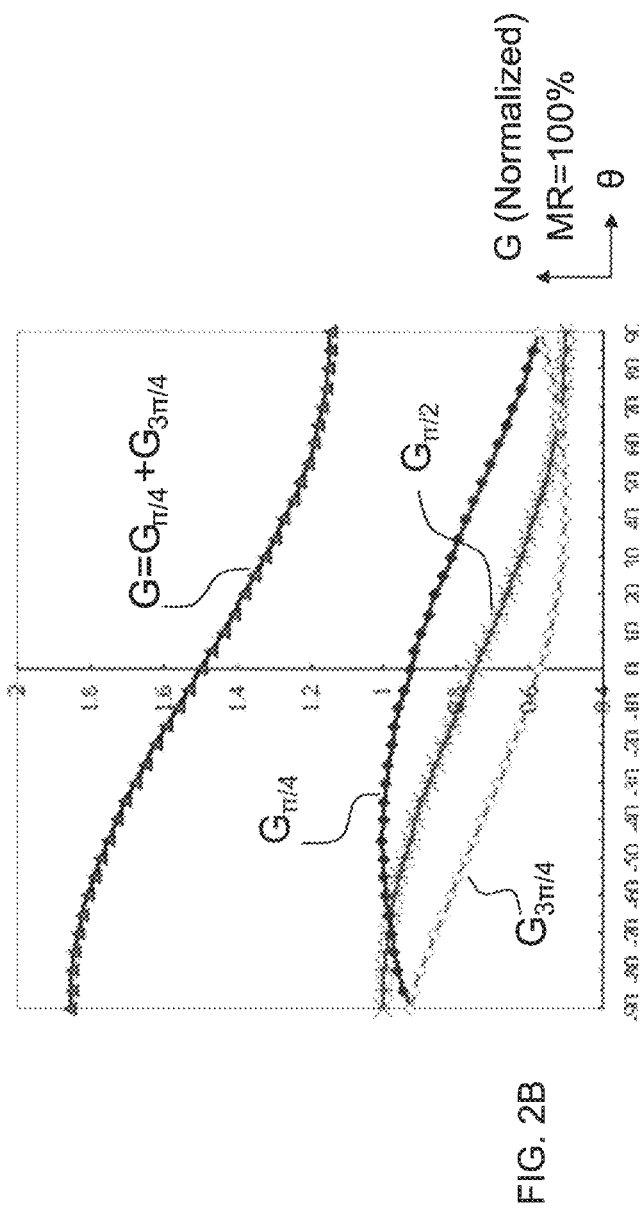
FIG. 2B illustrates curves representing theoretical conductivities of the MS-TMR of FIGS. 1A and 1B.

FIG. 2B depicts, as functions of the rotation angle θ, the general trends of the conductivity G of the MS-MTR 100, the conductivity $G_{\pi/4}$ of the first MTJ device 110a, the conductivity $G_{3\pi/4}$ of the second MTJ device 110b, and the conductivity $G_{\pi/2}$ of a conventional TMR.

In some embodiments, when the external magnetic field 402 is smaller than the coercivity $H_C$ of the first and second MTJ devices 110a and 110b, the following relationship holds:

$$\sin\theta \cong \frac{H_\perp}{H_C},$$

where $H_\perp$ is the intensity of the external magnetic field 402. As a result, by applying the above equation to Eq. (3), the external magnetic field 402 can be measured by solving the following linear relationship Eq. (4) for $H_\perp$:

$$G = G_P\left[1 + \frac{1 - \frac{MR}{\sqrt{2}}\frac{H_\perp}{H_C}}{1 + MR}\right]. \quad (4)$$

Figure 3A:
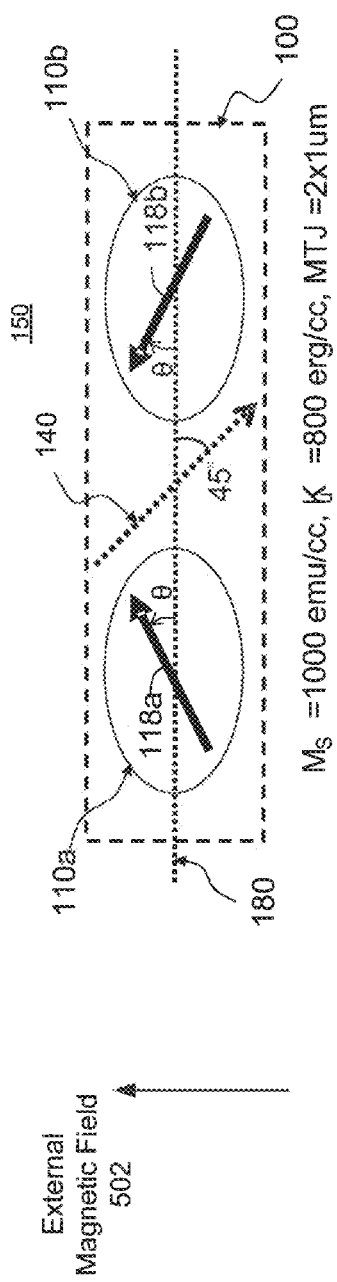
FIG. 3A illustrates a top view of another MS-TMR.

FIG. 3A illustrates another MS-TMR 150 generally corresponding to the MS-TMR 100 described above. In this embodiment, the first and second MTJ devices 110a and 110b each have substantially same oval shapes. A major axis of the oval shape has a length of substantially 2 microns, and a minor axis of the oval shape has a length of substantially 1 micron. The first and second free magnetic layers 116a and 116b have substantially same thicknesses, which is about 10 angstroms (Å), a saturation magnetization $M_s$ is substantially 1000 emu/cc, and an anisotropy constant $K_u$ is 800 erg/cc. An external magnetic field 502 is applied to the MS-TMR 150, substantially perpendicular to the easy axis 180 and substantially parallel to the plane of the first and second MTJ devices 110a and 110b. As a result, the first free magnetization 118a of the first MTJ device 110a and the second free magnetization 118b of the second MTJ device 110b are rotated counterclockwise and clockwise, respectively, by an angle θ.

Figure 3B:
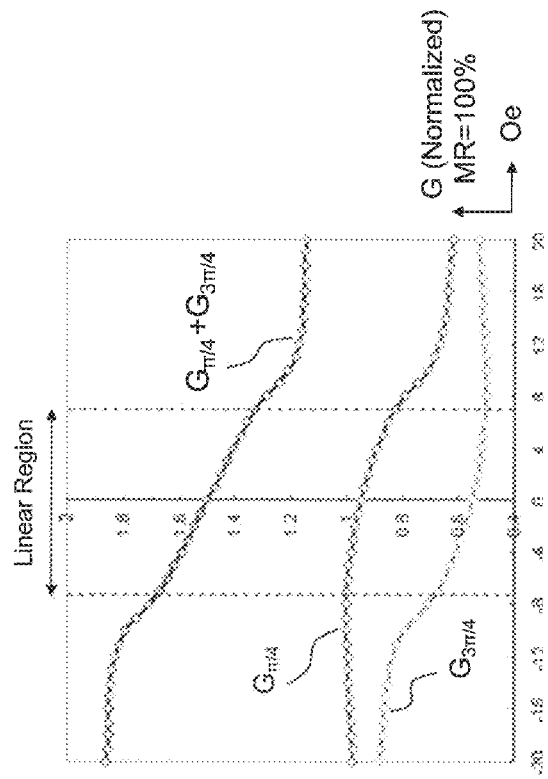
FIG. 3B illustrates curves representing simulated conductivities of the MS-TMR of FIG. 3A.

FIG. 3B illustrates, as functions of the external magnetic field 502, the simulated values of the conductivity G of the MS-MTR 150, the conductivity $G_{\pi/4}$ of the first MTJ device 110a, and the conductivity $G_{3\pi/4}$ of the second MTJ device 110b according to Eqs. (1), (2), and (3). As shown in FIG. 3B, the conductivity G of the MS-TMR 150 approximately linearly decreases as the external magnetic field increases. According to another embodiment, when the first and second pinned magnetizations 114a and 114b are reversed, the approximately linear relationship between the external magnetic field 502 and the conductivity G is reversed, accordingly. As a result, the conductivity of the MS-TMR 150 linearly increases as the external magnetic field 502 increases.

Figure 4:
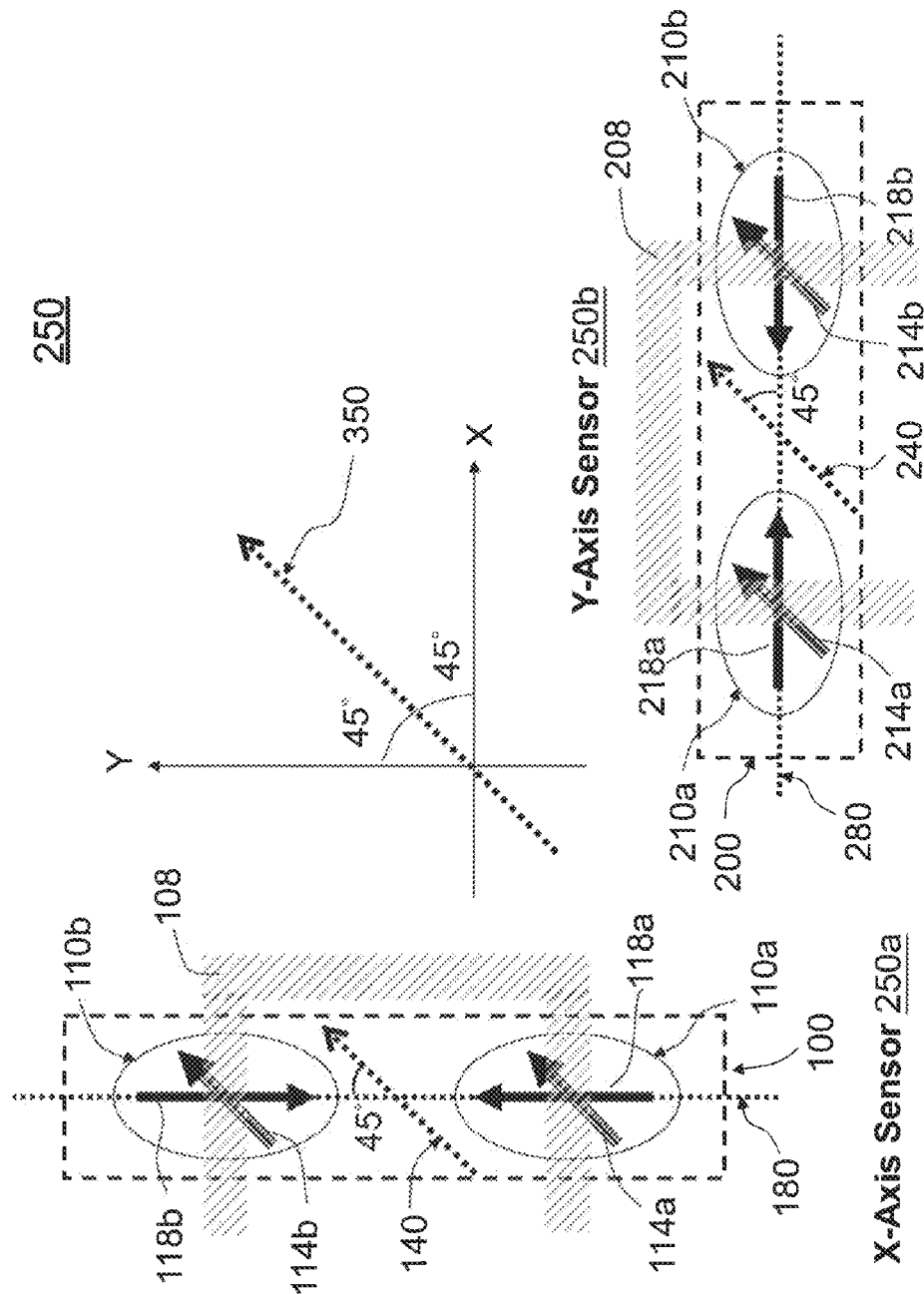
FIG. 4 illustrates a two-axis magnetic field sensor formed on a substrate, consistent with disclosed embodiments.

FIG. 4 illustrates a top-view of a two-axis magnetic field sensor 250 disposed on a single substrate or separate substrates, according to another embodiment of the disclosure. The two-axis magnetic field sensor 250 is presented in an X-Y coordinate for easy of reference, and can be used to sense the components along the X axis and the Y axis of an external magnetic field, simultaneously.

The two-axis magnetic field sensor 250 includes an X-axis magnetic field sensor 250a and a Y-axis magnetic field sensor 250b. The X-axis magnetic field sensor 250a and the Y-axis magnetic field sensor 250b generally correspond to the MS-TMR 100 depicted in FIGS. 1A and 1B. Accordingly, the same reference numerals refer to like elements. The X-axis magnetic field sensor 250a comprises a first MS-TMR 100 having a first easy axis 180 substantially parallel to the Y axis, a first pinned direction 140, and a first conductive wire 108. The Y-axis magnetic field sensor 250b comprises a second MS-TMR 200 having a second easy axis 280 substantially parallel to the X axis, a second pinned direction 240, and a second conductive wire 208. The first and second pinned directions 140 and 240 are both substantially parallel to a bisection direction 350, which evenly divides a section between the X axis and the Y axis. As a result, the bisection direction 350 forms an angle of about 45 degrees or 135 degrees with the X axis and the Y axis, respectively.

The first MS-TMR 100 and the second MS-TMR 200 have similar structures as the MS-TMR shown in FIGS. 1A and 1B. The planes of the first MS-TMR 100 and the second MS-TMR 200 are both parallel to the surface of the substrate. The first MS-TMR 100 includes a first MTJ device 110a having a first pinned magnetization 114a and a first free magnetization 118a. The first MS-TMR 100 further includes a second MTJ device 110b having a second pinned magnetization 114b and a second free magnetization 118b. The first and second pinned magnetizations 114a and 114b are substantially parallel to the first pinned direction 140. The first and second free magnetizations 118a and 118b are initially and substantially parallel to the first easy axis 180 but are in substantially opposite directions.

The second MS-TMR 200 includes a third MTJ device 210a having a third pinned magnetization 214a and a third free magnetization 218a. The second MS-TMR 200 further includes a fourth MTJ device 210b having a fourth pinned magnetization 214b and a fourth free magnetization 218b. The third and fourth pinned magnetizations 214a and 214b are substantially parallel to the second pinned direction 240. The third and fourth free magnetizations 218a and 218b are initially parallel to the second easy axis 280, but in substantially opposite directions.

Similar to the magnetic field sensor 10 depicted in FIGS. 1A and 1B, the X-axis magnetic field sensor 250a may sense an external magnetic field component along the X-axis, which is perpendicular to the first easy axis 180 and parallel to the plane of the substrate of the magnetic field sensor 250. Simultaneously, the Y-axis magnetic field sensor 250b may sense an external magnetic field component along the Y-axis, which is perpendicular to the second easy axis 280 and parallel to the plane of the substrate of the magnetic field sensor 250.

Figure 5:
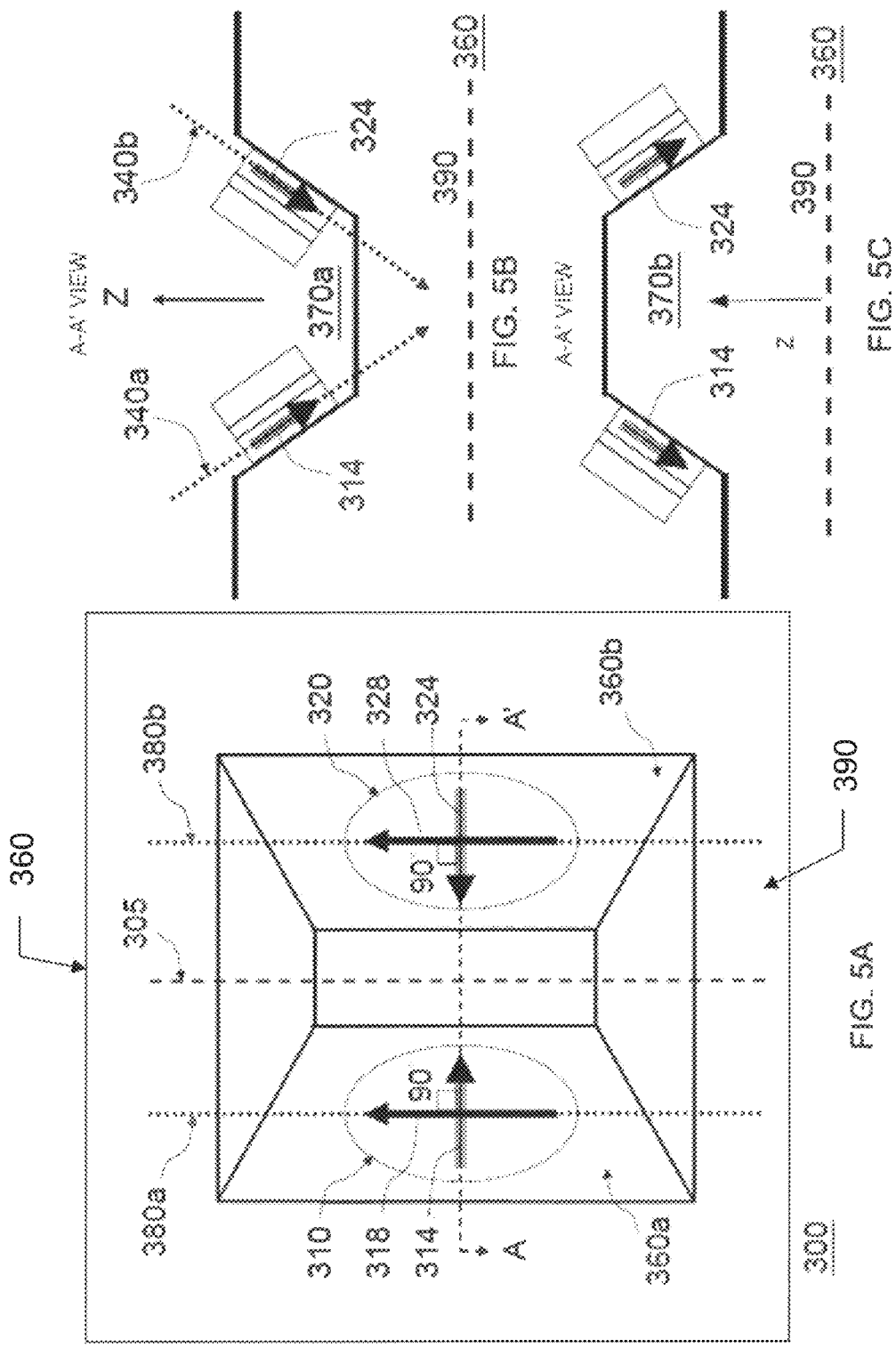
FIG. 5A illustrates a top view of a Z-axis magnetic field sensor, consistent with disclosed embodiments.
FIGS. 5B and 5C illustrate cross-sectional views of the Z-axis magnetic field sensor of FIG. 5A, consistent with disclosed embodiments.

FIGS. 5A-5C depict another magnetic field sensor 300 for sensing an external magnetic field along a Z-axis, which is perpendicular to the base plane 360 of the substrate 390, according to another embodiment. FIG. 5A depicts a top view of the magnetic field sensor 300, in which the Z axis is perpendicular to the base plane 360 of the substrate 390 and pointing upwards. The magnetic field sensor 300 is formed on the substrate 390, having a first inclined surface 360a and a second inclined surface 360b. The first inclined surface 360a and the second inclined surface 360b each form a bevel angle with the base plane 360, while the first inclined surface 360a and the second inclined surface 360b are formed symmetrically with respect to a medial axis 305 of the base plane 360.

Furthermore, the magnetic field sensor 300 has a first TMR 310 formed on the first inclined surface 360a and a second TMR 320 formed on the second inclined surface 360b. The first TMR 310 and the second TMR 320 each have a MTJ device similar to the first and second MTJ device 110a and 110b depicted in FIGS. 1A and 1B.

FIG. 5B illustrates a cross-sectional view of the magnetic field sensor 300 of FIG. 5A, according to one embodiment. As shown in FIG. 5B, the substrate 390 has a groove structure 370a. The first and second TMRs 310 and 320 are formed on the inside of the first and second inclined surfaces 360a and 360b of the groove structure 370a. As a result, the first and second TMRs 310 and 320 face towards each other.

Alternatively, as shown in FIG. 5C, which illustrates a cross-sectional view of the magnetic field sensor 300 of FIG. 5A, according to another embodiment. In FIG. 5C, the substrate 390 has a dike structure 370b, in which the first and second TMRs 310 and 320 are formed on the outside of the first and second inclined surfaces 360a and 360b. As a result, the first and second TMRs 310 and 320 face away from each other.

As further shown in FIG. 5A, the first and second TMRs 310 and 320 have substantially similar structures. The first TMR 310 has a first free magnetization 318 initially parallel to the first easy axis 380a, and a first pinned magnetization 314 parallel to the first pinned direction 340a (shown in FIG. 5B, for example). The first easy axis 380a is substantially parallel to the medial axis 305, and the first pinned direction 340a is substantially perpendicular to the first easy axis 380a and parallel to the first inclined surface 360a. The second TMR 320 has a second free magnetization 328 initially parallel to the second easy axis 380b, and a second pinned magnetization 324 parallel to the second pinned direction 340b (shown in FIG. 5B, for example). The second easy axis 380b is also substantially parallel to the medial axis 305, and the second pinned direction 340b is substantially perpendicular to the second easy axis 380b and parallel to the second inclined surface 360b.

The first and second pinned directions 340a and 340b are parallel to their respective first and second inclined surfaces 360a and 360b and point generally towards the negative direction of the Z axis (shown in FIGS. 5B and 5C). Alternatively, the first and second pinned directions 340a and 340b may be parallel to their respective first and second inclined surfaces 360a and 360b and point generally towards the positive direction of the Z axis. Because the pinned direction of each TMR is substantially perpendicular to the respective easy axis, the first and second free magnetizations 318 and 328 are in substantially the same direction or opposite directions, when there is no external magnetic field.

The first TMR 310 has a magnetic field sensing direction substantially perpendicular to the first easy axis 380a and parallel to the first inclined surface 360a. Likewise, the second TMR 320 has a magnetic field sensing direction substantially perpendicular to the second easy axis 380b and parallel to the second inclined surface 360b. The first and second pinned directions 314 and 324 are set by applying a magnetic field substantially perpendicular to the base plane 360 of the substrate 390 during an anneal process.

When an external magnetic field is applied to the magnetic field sensor 300, the fast TMR 310 and the second TMR 320 together sense the magnetic field component along the Z axis. The first and second free magnetizations 318 and 328 rotate in response to the external magnetic field, thereby changing the conductivity of the magnetic field sensor 300. Thus, magnetic field component along the Z axis may be determined based on the conductivity of the magnetic field sensor 300.

Figure 6:
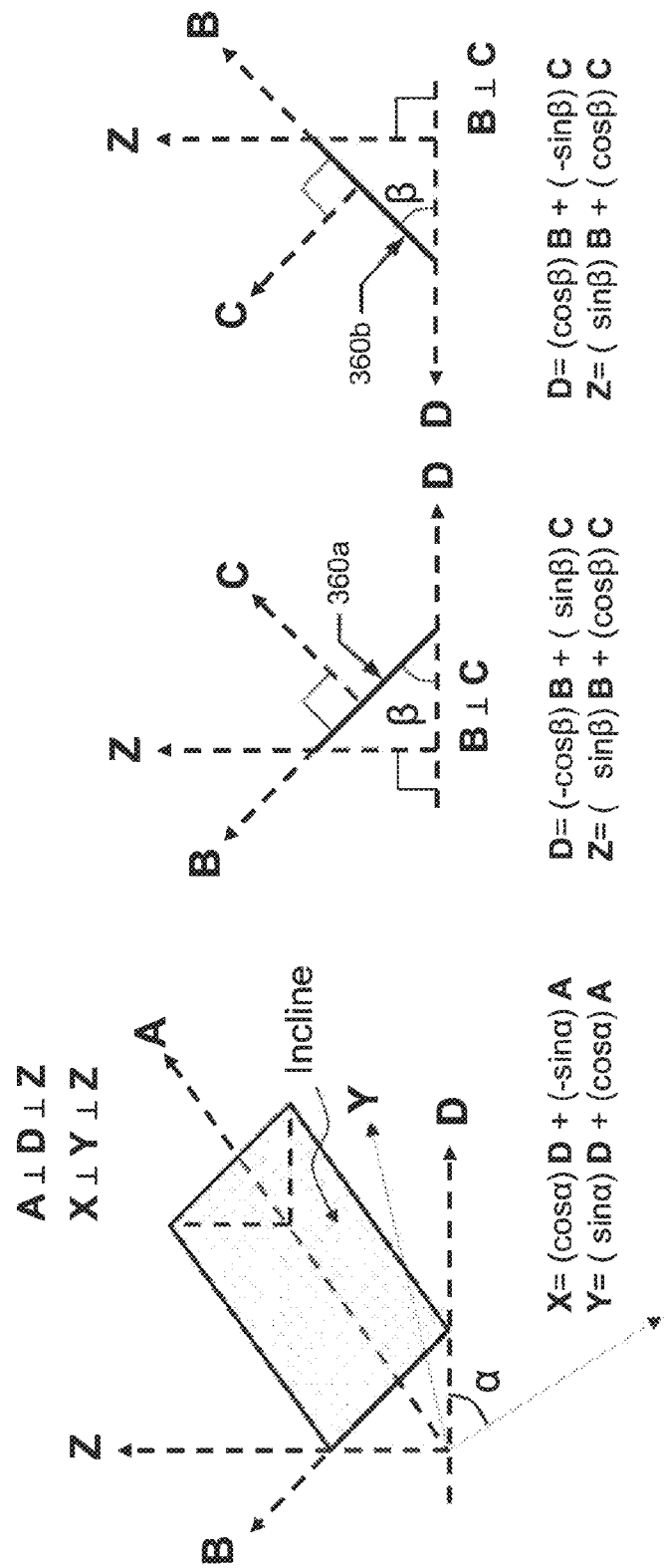
FIGS. 6A and 6B illustrate a coordinate transformation for the inclined surface of the substrate of the Z-axis magnetic field sensor of FIG. 5A, consistent with disclosed embodiments.

The magnetic field sensor 300 of FIG. 5A is further described below with reference to FIGS. 6A and 6B, which depict a coordinate transformation for the magnetic field sensor 300. The coordinate transformation transforms the first and second inclined surfaces 360a and 360b from a global X-Y-Z coordinate system to their respective A-B-C coordinate systems.

As shown in FIG. 6A, the global X-Y-Z coordinate system of the substrate is defined as follows: a Z axis is perpendicular to the base plane 360 of the substrate 390 and the X-Y plane is parallel to the base plane 360 of the substrate 390. For each of the first or second inclined surfaces 360a and 360b of the substrate 390, an A-D-Z coordinate system is further defined as follows: the Z axis is still the original Z axis, an A axis is perpendicular to the Z axis and is substantially parallel to the medial axis 305 on the base plane 360 of the substrate 390, and a D axis is perpendicular to the A and Z axes and forms an azimuth angle $\alpha$ with the X axis. Furthermore, as shown in a cross-sectional view in FIG. 6B for the first and second inclined surfaces 360a and 360b, a B axis is defined to be substantially parallel to the respective first and second inclined surface 360a and 360b and forms a bevel angle $\beta$ with the respective A-D plane. A C axis is normal to the respective first and second inclined surfaces 360a and 360b. Therefore, an external magnetic field can be represented by magnetic field components along the A, B, and C axes.

Furthermore, an external magnetic field in the global X-Y-Z coordinate system can be represented by a linear combination of the magnetic field components along the respective A, B, and C axes. When the magnetic field sensor 300 is placed in the external magnetic field, the first TMR 310 and the second TMR 320 sense the magnetic field components along their respective B axes, which are parallel to their respective first and second inclined surfaces 360a and 360b. As a result, when the first TMR 310 and the second TMR 320 are connected in parallel, the contributions to the conductivity by the magnetic field components along the X axis and Y axis cancel out each other, while the contributions by the magnetic field components along the Z axis add together. Hence, the magnetic field component along the Z axis may be determined based on the conductivity of the magnetic field sensor 300.

When an external magnetic field is applied to the magnetic field sensor 300 as shown in FIG. 5A, the conductivities $G_L$ and $G_R$ of the first and second TMRs 310 and 320 can be calculated from Eq. (5) and Eq. (6), respectively, as follows:

$$G_L = \frac{G_P}{2}\left[1 + \frac{1 + \frac{MR}{H_C}(H_X\cos\alpha\cos\beta + H_Y\sin\alpha\cos\beta - H_Z\sin\beta)}{1 + MR}\right], \quad (5)$$

and $$G_R = \frac{G_P}{2}\left[1 + \frac{1 - \frac{MR}{H_C}(H_X\cos\alpha\cos\beta + H_Y\sin\alpha\cos\beta + H_Z\sin\beta)}{1 + MR}\right], \quad (6)$$

where $G_p$, MR, $H_c$, $\alpha$ and $\beta$ are defined above, and $H_X$, $H_Y$, and $H_Z$ are the magnetic field components along the X, Y, and Z axes. The magnetic field component along the Z axis may be calculated from Eq. (7) as follows:

$$G = G_L + G_R \quad (7)$$
$$= G_P\left(1 + \frac{1 - MR\frac{H_Z}{H_C}\sin\beta}{1 + MR}\right).$$

Figure 7:
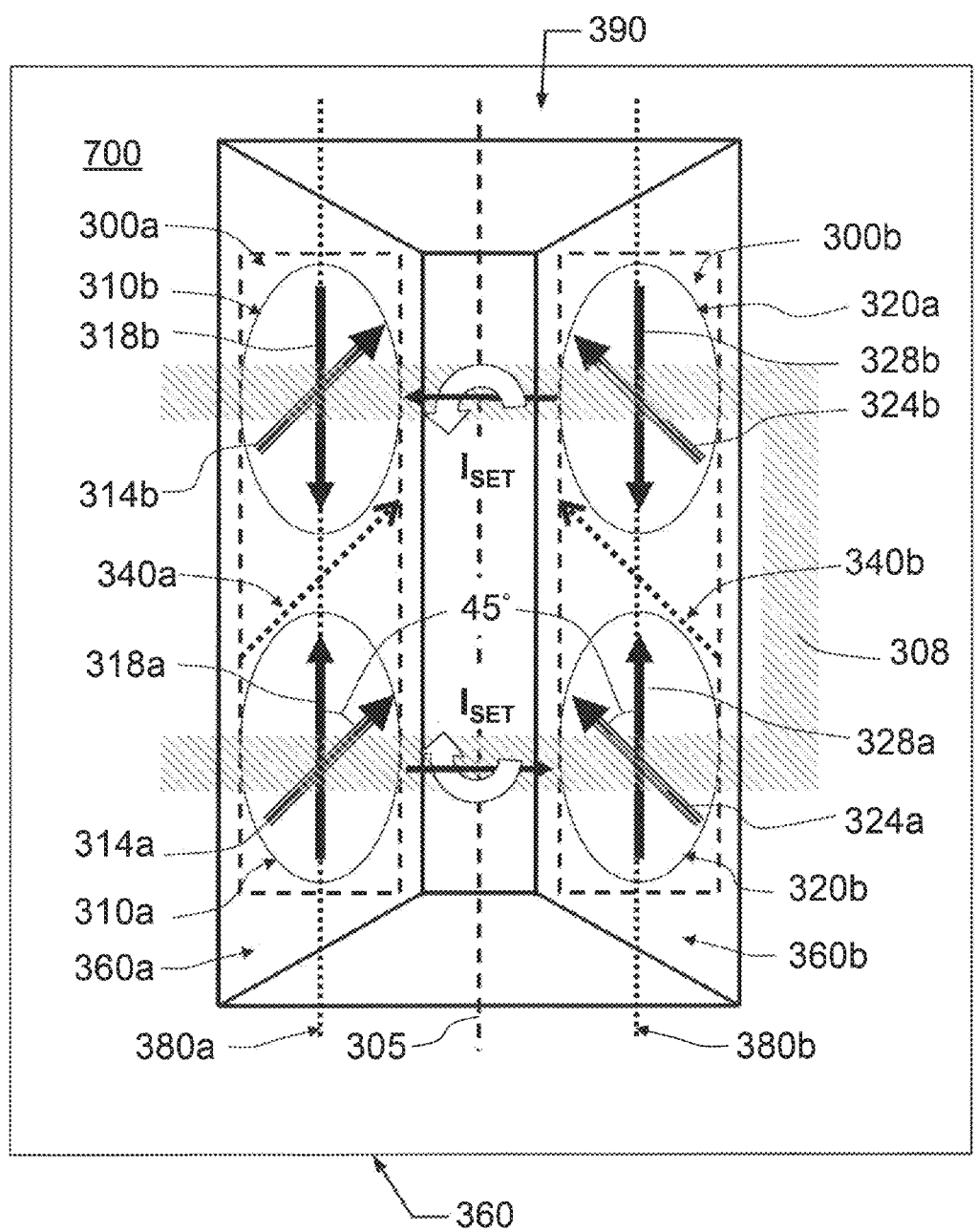
FIG. 7 illustrates a top view of a Z-axis magnetic field sensor, consistent with disclosed embodiments.

FIG. 7 depicts a top view a Z-axis magnetic field sensor 700 disposed on a substrate 390 with a base plane 360. As shown in FIG. 7, the first TMR 310 and second TMR 320 of FIG. 5A may be replaced with a first MS-TMR 300a and a second MS-TMR 300b, respectively. FIG. 7 uses same reference numerals to refer to like elements as described above in connection with FIG. 5A.

According to FIG. 7, the Z-axis magnetic field sensor 700 includes a first MS-TMR 300a and an a second MS-TMR 300b disposed on, respectively, a first inclined surface 360a and a second inclined surface 360b of the substrate 390. The first and second inclined surfaces 360a and 360b may form a groove similar to that shown in FIG. 5B or a dike structure similar to that shown in FIG. 5C. The first inclined surface 360a and the second inclined surface 360b form substantially same bevel angles with the base plane 360. In addition, the first inclined surface 360a and the second inclined surface 360b are symmetrically disposed with respect to a medial axis 305 of the base plane 360.

The first MS-TMR 300a has a first pinned direction 340a in the first inclined surface 360a, forming an angle of about 45 degrees or 135 degrees with a first easy axis 380a, which is substantially parallel to the axis 305. The second MS-TMR 300b has a second pinned direction 340b in the second inclined surface 360b, forming an angle of about 45 degrees or 135 degrees with a second easy axis 380b, which is also substantially parallel to the medial axis 305.

The first MS-TMR 300a includes a first MTJ device 310a and a second MTJ device 310b disposed on or over the first inclined surface 360a. The first MTJ device 3100a has a first free magnetization 318a and a first pinned magnetization 314a. The second MTJ device 310b has a second free magnetization 318b and a second pinned magnetization 314b. The first and second pinned magnetizations 314a and 314b both are substantially parallel to the first pinned direction 340a. The first and second free magnetizations 318a and 318b are both initially and substantially parallel to the first easy axis 380a and are substantially opposite to each other. In addition, the initial directions of the first and second free magnetizations 318a and 318b may be set by an ampere field generated by a set current flowing in a conductive wire 308. The first MTJ device 310a and the second MTJ device 310b are disposed between a top electrode and a bottom electrode, and have similar structures as those depicted in FIG. 1A.

Similarly, the second MS-TMR 300b includes a third MTJ device 320a and a fourth MTJ device 320b disposed on or over the second inclined surface 360b of the substrate. The third MTJ device 320a has a third free magnetization 328a and a third pinned magnetization 324a. The fourth MTJ device 320b has a fourth free magnetization 328b and a fourth magnetization 324b. Likewise, the third and fourth pinned magnetizations 324a and 324b are both substantially parallel to a second pinned direction 340b. The third and fourth free magnetizations 328a and 328b are both initially parallel to the second easy axis 380b and in substantially opposite directions, which are set by the ampere field generated by the current flowing in the wire 308. In addition, the third MTJ device 320a and the fourth MTJ device 320b are disposed between a top electrode and a bottom electrode similar to those shown in FIG. 1A.

The Z-axis magnetic field sensor 700 is formed by coupling or connecting the first and second MS-TMRs 300a and 300b in parallel. The top electrodes of the first and second MS-TMRs 300a and 300b are connected together, and the bottom electrodes of the first and the second MS-TMRs 300a and 300b are connected together. The first easy axis and the second easy axis 380a and 380b are substantially parallel to a medial axis 305 of the base plane 360 of the substrate 390. The first and second pinned directions 340a and 340b each form an angle of about 45 degrees or 135 degrees with the respective easy axes 380a and 380b on or over the respective first and second inclined surfaces 360a and 360b. When an external magnetic field is applied, the conductivity of the Z-axis magnetic field sensor 700 varies according to the magnetic field component ($H_z$) along the Z axis. As a result, the Z-axis magnetic field component ($H_z$) may be sensed and determined through the conductivity of the Z-axis magnetic field sensor 700. The conductivity of the Z-axis magnetic field sensor 700 of FIG. 7 may be calculated by Eq. (8).

$$G = 2G_P \left(1 + \frac{1 - \frac{MR}{\sqrt{2}} \frac{H_Z}{H_C} \sin\beta}{1 + MR}\right), \quad (8)$$

where $G_p$, MR, $H_c$, $H_z$, and β are defined above. Compared with existing magnetic field sensors, the parallel connection of the first MS-TMR 300a and second MS-TMR 300b in the Z-axis magnetic field sensor 700 may allow the bevel angle β between the inclined surface (i.e., first and second inclined surfaces 360a and 360b) and the based plane 360 of the substrate 390 to be less than 45 degrees without compromising the ability to sensor the Z-axis magnetic component. As a result, the dimension of the Z-axis magnetic field sensor 700 may be reduced, thereby allowing easy integration into electronic devices for application systems, such as compass chips of GPS systems or mobile phones.

Figure 8:
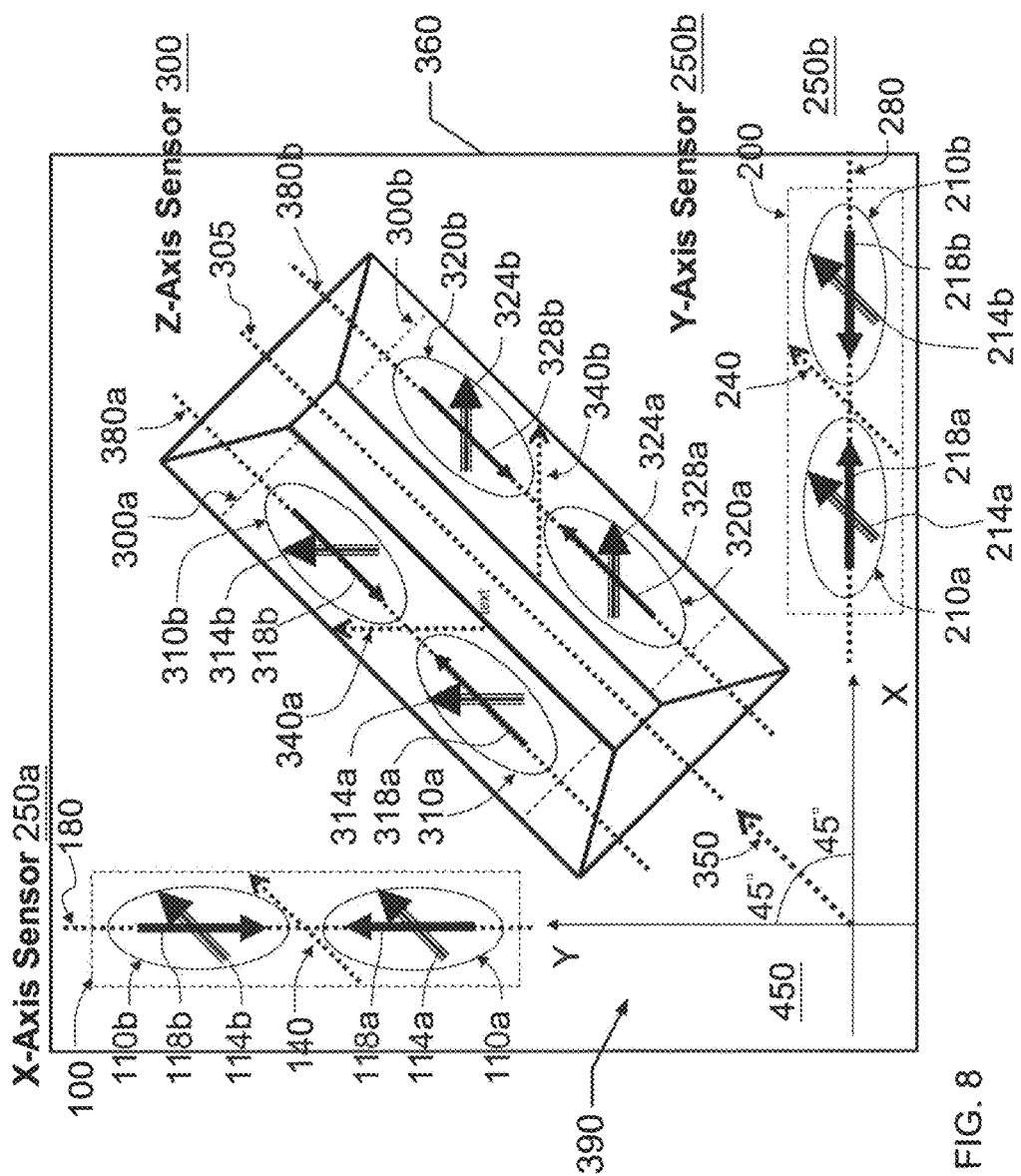
FIG. 8 illustrates a top view of a three-axis magnetic field sensor, consistent with disclosed embodiments.

FIG. 8 depicts a top view of a three-axis magnetic field sensor 450 disposed on a substrate 390 with a base plane 360, according to another embodiment. In FIG. 8, the three-axis magnetic field sensor 450 is presented in an X-Y-Z coordinate system, in which the X-Y plane is substantially parallel to the base plane 360, while the Z axis points upwards (i.e., towards a viewer) and perpendicular to the base plane 360. The three-axis magnetic field sensor 450 includes, in an integrated form, a two-axis magnetic field sensor 250 as disclosed in FIG. 4 and a Z-axis magnetic field sensor 700 as disclosed in FIG. 7. For ease of understanding, the same reference numerals are used to refer to like elements in FIG. 8.

The two-axis magnetic field sensor 250 further includes an X-axis magnetic field sensor 250a having a first MS-TMR 100 and a Y-axis magnetic field sensor 250b having a second MS-TMR 200. The first MS-TMR 100 has a first easy axis 180 substantially parallel to the Y axis and a first pinned direction 140 substantially parallel to the bisection direction 350 of the X-Y plane, which evenly divides the angle between the X and Y axes. The second MS-TMR 200 has a second easy-axis 280 substantially parallel to the X-axis and a second pinned direction 240 also substantially parallel to the bisection direction 350. The plane of the first MS-TMR 100 is parallel to the base plane 360 and the sensing direction is perpendicular to first easy axis 180 and along the X axis. The plane of the second MS-TMR 200 is parallel to the base plane 360 and the sensing direction is perpendicular to second easy axis 280 and along the Y axis.

The Z-axis magnetic field sensor 300 includes two MS-TMRs (i.e., a third MS-TMR 300a and a fourth MS-TMR 300b) disposed on or over the first and second inclined surfaces 360a and 360b of the substrate 390. The first inclined surface 360a and the second inclined surface 360b form substantially same bevel angles with the base plane 360. The first inclined surface 360a and the second inclined surface 360b are symmetrically formed with respect to a medial axis 305 of the X-Y plane, in which the medial axis 305 is parallel to the bisection direction 350. The third MS-TMR 300a has a third easy axis 380a and a third pinned direction 340a, and the fourth MS-TMR 300b has an fourth easy axis 380b and a fourth pinned direction 340b. The third easy axis 380a and the fourth easy axis 380b are substantially parallel to the medial axis 305. The third and fourth pinned directions 340a and 340b are in the respective first and second inclined surfaces 360a and 360b and form an angle of about 45 degrees or 135 degrees with the third and fourth easy axes 380a and 380b, respectively.

As further shown in FIG. 8, the first MS-TMR 100 has a first MTJ device 110a with a first free magnetization 118a and a first pinned magnetization 114a and a second MTJ device 110b with a second free magnetization 118b and a second pinned magnetization 114b. The first and second pinned magnetizations 114a and 114b are substantially parallel to the first pinned direction 140. The first and second free magnetizations 118a and 118b are initially parallel to the first easy axis 180 and are set to substantially opposite directions. The second MS-TMR 200 has a third MTJ device 210a with a third free magnetization 218a and a third pinned magnetization 214a and a fourth MTJ device 210b with a fourth free magnetization 218b and a fourth pinned magnetization 214b. The third and fourth pinned magnetizations 214a and 214b are substantially parallel to the second pinned direction 240. The third and fourth free magnetizations 218a and 218b are initially parallel to the second easy axis 280 and are set to substantially opposite directions. As a result, the first and second pinned magnetizations 114a and 114b each form an angle of about 45 degrees or 135 degrees with the respective the first and second free magnetizations 118a and 118b. Similarly, the third and fourth pinned magnetizations 214a and 214b each form an angle of about 45 degrees or 135 degrees with the respective third and fourth free magnetizations 218a and 218b.

The third MS-TMR 300a has a fifth MTJ device 310a with a fifth free magnetization 318a and a fifth pinned magnetization 314a and a sixth MTJ device 310b with a sixth free magnetization 318b and a sixth pinned magnetization 314b. The fifth and sixth pinned magnetizations 314a and 314b are both substantially parallel to the third pinned direction 340a. The fifth and sixth free magnetizations 318a and 318b are initially parallel to the third easy axis 380a and are set to substantially opposite directions. The fourth MS- TMR 300b has a seventh MTJ device 320a with a seventh free magnetization 328a and a seventh pinned magnetization 324a and an eighth MTJ device 320b with an eighth free magnetization 328b and an eighth pinned magnetization 324b. The seventh and eighth pinned magnetizations 324a and 324b are both substantially parallel to the fourth pinned direction 340b. The seventh and eighth free magnetizations 328a and 328b are initially parallel to the fourth easy axis 380b and are set to substantially opposite directions. As a result, the fifth and sixth pinned magnetizations 314a and 314b each form an angle of about 45 degrees or 135 degrees with the respective fifth and sixth free magnetizations 318a and 318b. Similarly, the seventh and eighth pinned magnetizations 324a and 324b each form an angle of about 45 degrees or 135 degrees with the respective seventh and eighth free magnetizations 328a and 328b.

As described above in connection with FIGS. 4 and 7, each magnetic field sensor also has a respective conductive wire for flowing the set current to generate an ampere field therein and set the initial orientation of the respective free magnetization. For easy of illustration, the conductive wires are not shown in FIG. 8.

When the three-axis magnetic field sensor 450 is subjected to an external magnetic field, the components of the external magnetic field along the X, Y, and Z axes may be sensed simultaneously in consistence with the embodiments disclosed herein.

Figure 9:
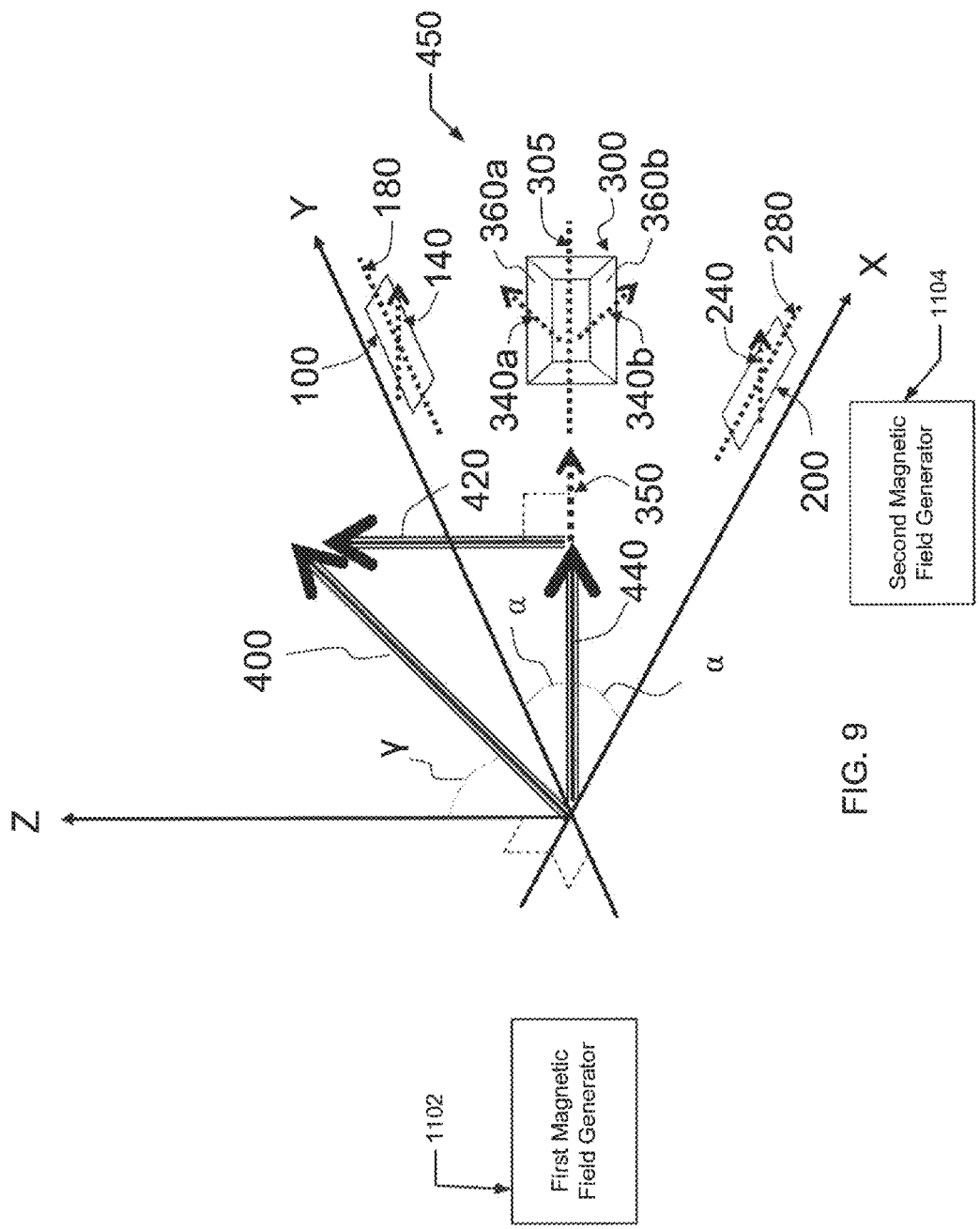
FIG. 9 illustrates an annealing process for setting the pinned magnetizations of the MS-TMR of FIG. 8, consistent with disclosed embodiments.

FIG. 9 is a schematic diagram for setting the pinned magnetization of each MS-TMR of the magnetic field sensors, as depicted in FIGS. 1A-8, by applying a single slantwise magnetic field or dual magnetic fields during an annealing process, consistent with disclosed embodiments. According to one embodiment, as shown in FIG. 9, the three-axis magnetic field sensor 450 of FIG. 8 is presented in an X-Y-Z coordinate system as described above. A slantwise field 400, which forms a zenith angle γ with the Z axis, is applied to the three-axis magnetic field sensor 450 during the annealing process. Furthermore, the slantwise field 400 is positioned so that the projection of the slantwise field 400 in the X-Y plane is substantially parallel to the bisection direction 350 and forms an azimuth angle α of about 45 degrees with the X and Y axes, respectively. As a result, the first and second pinned directions 140 and 240 of the first and second MS-TMRs 100 and 200 are set to be substantially parallel to the bisection direction 350.

The zenith angle γ is set according to the bevel angle β between the inclined surface (i.e., the first and second inclined surfaces 360a and 360b) and the base plane 360 of the substrate 390 as shown in FIG. 6B. The zenith angle γ may be calculated according to Eq. (9) as follows:

$$\gamma = \tan^{-1}(\sin \beta). \tag{9}$$

For example, when the bevel angle β=54°, the azimuth angles α=45° and the zenith angles γ=39° for the slantwise field 400. Accordingly, the projections of the slantwise field 400 onto the first and second inclined surfaces 360a and 360b form an angle of about 45 degrees or 135 degrees with the third and fourth easy axes 380a and 380b, respectively. As a result of the slantwise field 400, the third and fourth pinned directions 340a and 340b are set to be substantially parallel to the projections of the slantwise field 400 on the first and second inclined surfaces 360a and 360b, respectively. According to a further embodiment, for an anneal instrument with a single magnetic field generator, the azimuth and zenith angles may be set by physically rotating and tilting the three-axis magnetic field sensor 450 with respect to the magnetic field 400 so as to achieve the desired angles for the pinned magnetization as described herein.

According to another embodiment as further shown in FIG. 9, a dual field annealing process may be used to set the pinned magnetizations by applying a zenith magnetic field 420 and an azimuth magnetic field 440 to the three-axis magnetic field sensor 450. The zenith magnetic field 420 is substantially parallel to the Z axis, and the azimuth magnetic field 440 is substantially parallel to the X-Y plane along the bisection direction 350. The zenith magnetic field 420 and the azimuth magnetic field 440 have a relationship described by Eq. (10) as follows:

$$H_{AZ} = H_Z \sin \beta, \tag{10}$$

The dual field annealing process may be performed by an anneal instrument having a horizontal first magnetic field generator 1102 and a vertical second magnetic field generators 1104. In the dual field annealing process, the mechanical manipulation (e.g., tilting and rotating) of the three-axis magnetic field sensor 450 may be replaced by electronic signal controlling of the horizontal first magnetic field generator 1102 and the vertical second magnetic field generator 1104. Accordingly, the pinned magnetization of each MS-TMR can be set by simultaneously applying the azimuth magnetic field 440 and the zenith magnetic field 420, which are generated by the horizontal first and vertical second magnetic field generators 1102 and 1104. The intensity of the zenith magnetic field 420 and the azimuth magnetic field 440 is set by the generators so that a vector summation of the zenith magnetic field 420 and the azimuth magnetic field 440 is equivalent to the slantwise field 400 described above.

According to the above embodiment, the pinned magnetization of a MS-TMR disposed on the inclined surface may be set based on the bevel angle of the inclined surface. Accordingly, the magnetic field sensors described above allow for a wider range of the bevel angle of the inclined surfaces. The actual angles between the pinned magnetizations and their respective easy axis of a MS-TMR may deviate from 45 degrees or 135 degrees after the annealing process. For example, the deviation may be caused by the easy axis deflection resulted from MTJ pattern shape distortions, variations of the zenith and azimuth angles of the slantwise field, or a quantity tolerance of the zenith and azimuth magnetic field. Accordingly, the angle between the pinned direction and the easy axis may vary between about 40 to 50 degrees, between about 35 to 55 degrees, between about 130 to 140 degrees, or between about 125 to 145 degrees. Nevertheless, the magnetic field sensors described above can still properly respond to the external magnetic fields with the deviations of the angle between the pinned direction and the easy axis.

Figure 10:
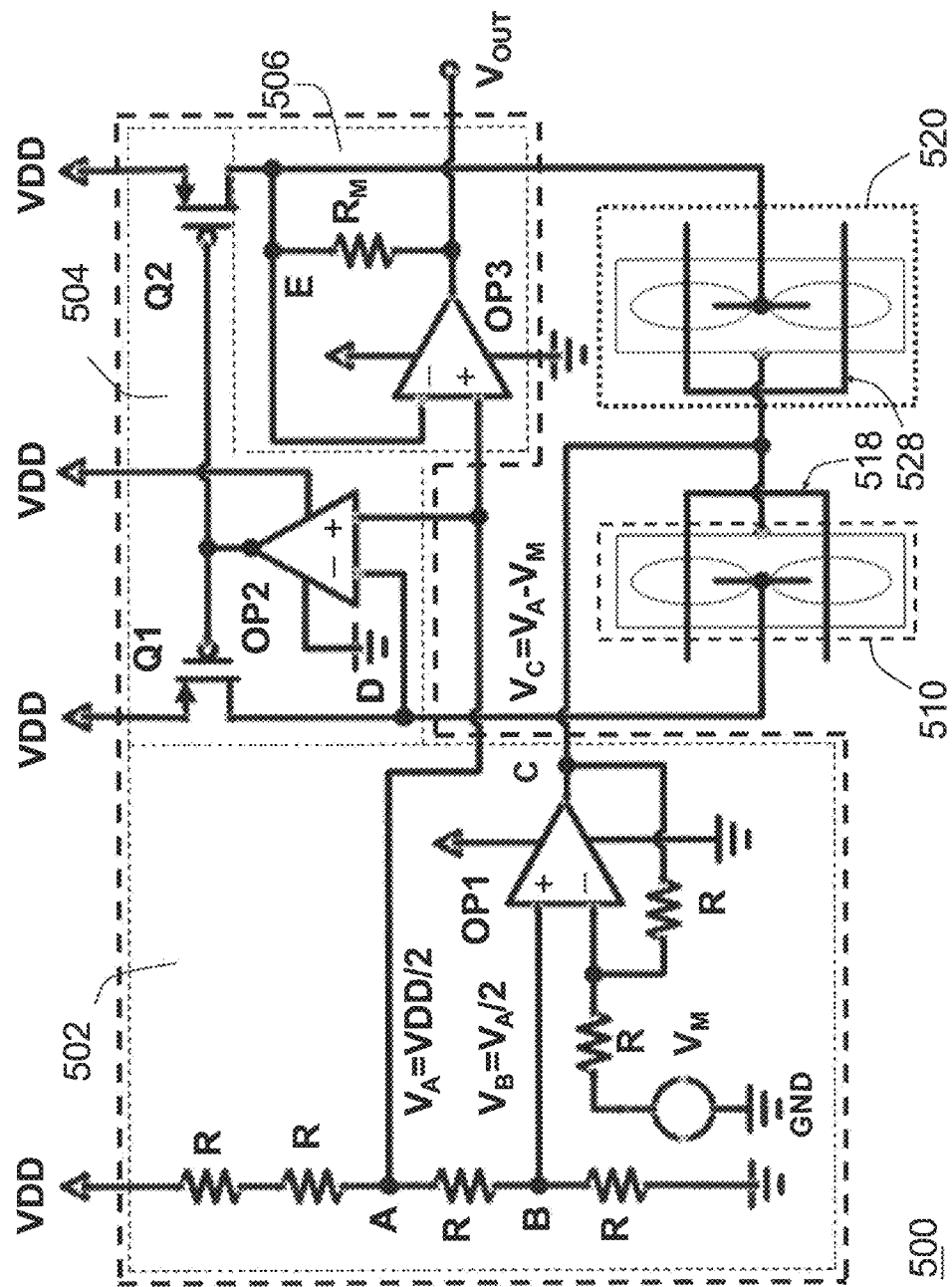
FIG. 10 illustrates a circuit diagram for sensing an external magnetic field, consistent with disclosed embodiments.

According to another embodiment of the disclosure, the magnetic field sensors described above may be integrated with a CMOS sensing circuit and fabricated together with the CMOS sensing circuit. FIG. 10 illustrates a circuit diagram of a magnetic field sensing circuit 500 for sensing an external magnetic field and converting the external magnetic field into electronic signals. The magnetic field sensing circuit 500 includes a first magnetic field sensor 510 and a second magnetic field sensor 520. The second magnetic field sensor 520 provides measurements of the external magnetic field, while the first magnetic field sensor 510 provides a zero-field reference to the magnetic field sensing circuit 500. The first and second magnetic field sensors 510 and 520 have substantially same configurations and may be any magnetic field sensor described above. In addition, unlike the traditional Wheatstone bridge circuit for TMR magnetic field sensors, no shielding is required for the magnetic field sensing circuit 500.

In the beginning of sensing an external magnetic field, a set current is passed through the respective conductive wires 518 and 528 of the first and second magnetic field sensors 510 and 520 to generate ampere fields in the first and second magnetic field sensors 510 and 520 to restore their respective free magnetizations to an initial state, so that the free magnetizations of each of the first and second magnetic field sensors 510 and 520 are substantially parallel with the respective easy axis and in substantially opposite directions. Thereafter, the set current in the conductive wire 518 is maintained, while the set current in the conductive wire 528 turned off. As a result, the free magnetizations of the first magnetic field sensor 510 are kept or locked at the initial state and not affected by any external magnetic field. Hence, the first magnetic field sensor 510 reflects a zero-field status and provides the zero-field reference. On the other hand, the free magnetizations of the second magnetic field sensor 520 may be affected by the external magnetic field so that the second magnetic field sensor 520 may sense the external magnetic field.

As shown in FIG. 10, in addition to the first and second magnetic field sensors 510 and 520, the magnetic field sensing circuit 500 includes a bias voltage unit 502, a clamp voltage current mirror unit 504, and a signal transferring and amplifying unit 506. The bottom electrode of the zero-field reference of the first magnetic field sensor 510 and the bottom electrode of the second magnetic field sensor 520 are connected to a node C. The top electrode of the zero-field reference of the first magnetic field sensor 510 is connected to a node D, and the top electrode of the second magnetic field sensor 520 is connected to a node E.

As further shown in FIG. 10, the bias voltage unit 502 includes a voltage dividing branch, a voltage subtraction circuit, and a voltage source $V_M$. The voltage dividing branch includes four resistors R connected in series between a power voltage VDD and a ground voltage GND. As a result, the voltages at node A and node B are $V_A$=VDD/2 and $V_B$=VDD/4, respectively. The subtraction circuit includes an operational amplifier OP1 having a positive input coupled to the node B. A resistor R is connected between a negative input and an output of the amplifier OP1. Another resistor R is connected between the negative input of the amplifier OP1 and the voltage source $V_M$. Accordingly, the output voltage of the amplifier OP1 at node C is $V_C=V_A-V_M$. Hence, the voltages across the MTJ devices of the zero-field reference of the first magnetic field sensor 510 and the second magnetic field sensor 520 are biased at the voltage $V_M$ therein.

The clamp voltage current mirror unit 504 includes a current mirror and a voltage clamper. The current mirror includes a first PMOS transistor Q1 and a second PMOS transistor Q2. The sources of the transistor Q1 and the transistor Q2 are both connected to the voltage VDD. The drain of the transistor Q1 is connected to the node D, the drain of the transistor Q2 is connected to a node E, and the gate of the transistor Q1 connects to the gate of the transistor Q2. The voltage clamper includes an operational amplifier OP2 having a positive input connected to the node A, and a negative input connected to the node D. The output of the amplifier OP2 is connected to the gates of the transistors Q1 and Q2. The drain current of the second PMOS transistor Q2 is a mirror of the drain current of the first PMOS transistor Q1, wherein the drain current of the first PMOS transistor Q1 is equal to the current of the zero-field reference of the first magnetic field sensor 510.

The signal transfer amplifying unit 506 includes an operational amplifier OP3 having a negative input connected to the node E and a positive input connected to the node A. A resistor $R_M$ is connected between the node E and the output of the operational amplifier OP3. The power of the operational amplifiers OP1, OP2, and OP3 are provided by a single voltage VDD. The output of amplifier OP2 is fed back to the negative input of amplifier OP2 via the transistor Q1. The output of amplifier OP3 is fed back to the negative input of amplifier OP3 via the resistor $R_M$. As a result, the voltages at the negative inputs of amplifiers OP2 and OP3 are substantially equal to the voltages at the respective positive inputs, and the voltages at nodes D and E are clamped to the voltage of node A and equal to VDD/2.

At the node E, the current flowing into the second magnetic field sensor 520 is a sum of the current flowing out from the drain of the second PMOS transistor Q2 and a current flowing through the output of the operational amplifier OP3 via the resistor $R_M$. Therefore, the current of the second magnetic field sensor 520 in substantially equal to a sum of the current of the zero-field reference of the first magnetic field sensor 510 and a sensed current due to the conductivity change of the second magnetic field sensor 520 caused by the external magnetic field. The output voltage of the operational amplifier OP3 (i.e., the output voltage $V_{OUT}$ of signal transfer amplifying unit 506) is equal to the sum of the voltage at node E (i.e., VDD/2) and the voltage across the resistor $R_M$. The voltage across the resistor $R_M$ is the product of the sensed current multiplied by the resistance value of the resistor $R_M$, and the sensed current is equal to the product of the bias voltage $V_M$ and the conductivity change $\Delta G$ of the second magnetic field sensor 520.

As a result, the output voltage $V_{OUT}$ of the signal transfer amplifying unit 506 is one half of the voltage VDD, when there is no external magnetic field. This design provides a full range of signal amplification and is favorable for a subsequent Analog-to-Digital Convert (ADC) that is used to convert the output signal $V_{OUT}$ to a digital form.

When the second magnetic field sensor 520 is subject to an external magnetic field, the output voltage $V_{OUT}$ of the signal transfer amplifying unit 506 is the sum of one half of the voltage VDD and the voltage across the resistor $R_M$. According to a further embodiment, the value of resistor $R_M$ may be arranged to optimize the range of the output voltage $V_{OUT}$ in according with the specification of the subsequent ADC.

As described above, the sensing circuit depicted in FIG. 10 can be used for sensing magnetic fields along the X, Y, and Z axes when the corresponding X, Y, and Z-axis magnetic field sensors are incorporated into the circuit. The back-end fabrication process of the first and second magnetic field sensors 510 and 520 can be integrated with the front-end fabrication process of the sensing circuit depicted in FIG. 10. The sensing circuit and the sensors may be integrated on the same substrate. Alternatively, the sensing circuit may also be separately fabricated, and may include other components. It should be noted that the bottom electrode and the top electrode in each MS-TMR described above for connecting the MTJ devices are not limited to the structure described herein and may take other proper forms or implementations.

The embodiments disclosed herein provide a structure of a Tunneling Magneto-Resistor (TMR) and a method for sensing magnetic fields. The disclosed TMR structures and methods greatly reduce the complexity and the cost of manufacturing magnetic sensors and also improve sensitivity and accuracy of magnetic sensing.

What is claimed is:

1. A magnetic sensor for sensing an external magnetic field, comprising:
a first electrode and a second electrode disposed over a substrate;
a first magnetic tunneling junction and a second magnetic tunneling junction conductively disposed between the first electrode and the second electrode and connected in parallel between the first electrode and the second electrodes, the first magnetic tunneling junction and the second magnetic tunneling junction being arranged along a first easy axis of the magnetic sensor;
the first magnetic tunneling junction including a first pinned layer having a first pinned magnetization, a first free layer having a first free magnetization, and a first tunneling layer between the first pinned layer and the first free layer;
the second magnetic tunneling junction including a second pinned layer having a second pinned magnetization, a second free layer having a second free magnetization, and a second tunneling layer between the second pinned layer and the second free layer;
the first free magnetization and the second free magnetization being arranged substantially in parallel to the first easy axis and in substantially opposite directions; and
the first pinned magnetization and the second pinned magnetization each forming an angle of about 45 or 135 degrees with the first easy axis,
wherein the substrate has a first inclined surface, a second inclined surface, and a base plane, the first inclined surface and the second inclined surface each forming a respective bevel angle with the base plane;
the first magnetic tunneling junction and the second magnetic tunneling junction are disposed on the first inclined surface of the substrate between the first electrode and the second electrode; and
the magnetic sensor further comprising:
a third magnetic tunneling junction and a fourth magnetic tunneling junction disposed on the second inclined surface of the substrate between a third electrode and a fourth electrode, the third magnetic tunneling junction and the fourth magnetic tunneling junction being connected in parallel and arranged along a second easy axis that is substantially parallel to the first easy axis, wherein:
the third magnetic tunneling junction has a third free layer having a third free magnetization and a third pinned layer having a third pinned magnetization;
the fourth magnetic tunneling junction has a fourth free layer having a fourth free magnetization and a fourth pinned layer having a fourth pinned magnetization;
the third and fourth pinned magnetizations each form an angle of about 45 or 135 degrees with the second easy axis;
the third and fourth free magnetizations are parallel to the second easy axis and in substantially opposite directions; and
a conductive wire passes through the first, second, third, and fourth magnetic tunneling junctions for carrying a set current to generate the first, second, third, and fourth free magnetizations therein.

2. The magnetic sensor of claim 1, wherein:
the first magnetic tunneling junction and the second magnetic tunneling junction have substantially similar oval shapes each having a major axis substantially parallel to the first easy axis; and
planes of the first magnetic tunneling junction and the second magnetic tunneling junction are substantially parallel to a base plane of the substrate.

3. The magnetic sensor of claim 1, further comprising:
a first conductive wire passing through the first magnetic tunneling junction and the second magnetic tunneling junction and carrying a current for setting the first and second free magnetizations.

4. The magnetic sensor of claim 1, wherein:
the first and second free magnetizations rotate within respective planes of the first magnetic tunneling junction and the second magnetic tunneling junction when an external magnetic field is applied to the magnetic sensor; and
a conductivity of the magnetic sensor changes in response to the rotations of the first and the second free magnetizations.

5. The magnetic sensor of claim 4, wherein the first and the second free magnetizations rotate in response to a first external magnetic field or a first external magnetic field component that is substantially perpendicular to the first easy axis and substantially parallel to a base plane of the substrate.

6. The magnetic sensor of claim 5, wherein the conductivity of the magnetic sensor changes substantially linearly in response to the first magnetic field or the first magnetic field component.

7. The magnetic sensor of claim 1, further comprising:
a third electrode and a fourth electrode; and
a third magnetic tunneling junction and a fourth magnetic tunneling junction disposed between the third electrode and the fourth electrode and connected in parallel between the third electrode and the fourth electrode, the third magnetic tunneling junction and the fourth magnetic tunneling junction being arranged along a second easy axis that is substantially perpendicular to the first easy axis, wherein:
the third magnetic tunneling junction has a third pinned magnetization and a third free magnetization;
the fourth magnetic tunneling junction has a fourth pinned magnetization and a fourth free magnetization;
the third and fourth pinned magnetizations each form an angle of about 45 or 135 degrees with the second easy axis; and
the third and fourth free magnetizations are parallel to the second easy axis and in substantially opposite directions.

8. The magnetic sensor of claim 7, wherein:
the third magnetic tunneling junction and the fourth magnetic tunneling junction have substantially similar oval shapes each having a major axis substantially parallel to the second easy axis; and
the first, second, third, and fourth magnetic tunneling junctions are substantially parallel to a base plane of the substrate.

9. The magnetic sensor of claim 7, further comprising:
a second conductive wire passing through the third magnetic tunneling junction and the fourth magnetic tunneling junction and carrying a current for setting the third and fourth free magnetizations.

10. The magnetic sensor of claim 7, wherein:
the third and fourth free magnetizations rotate within respective planes of the third magnetic tunneling junction and the fourth magnetic tunneling junction when an external magnetic field is applied to the magnetic sensor; and
the conductivity of the magnetic sensor changes in response to the rotations of the third and fourth free magnetizations.

11. The magnetic sensor of claim 10, wherein the third and fourth free magnetization rotate in response to a second external magnetic field or a second external magnetic field component that is substantially perpendicular to the second easy axis and substantially parallel to a base plane of the substrate.

12. The magnetic sensor of claim 1, wherein the first, second, third, and fourth magnetic tunneling junctions are connected in parallel and the first, second, third, and fourth free magnetization rotate within respective planes of the first, second, third, and fourth magnetic tunneling junctions in response to an external magnetic field, and the conductivity of the magnetic sensor changes in response to the external magnetic field component that is substantially perpendicular to the base plane of the substrate.

13. The magnetic sensor of claim 1, wherein the first inclined surface and the second inclined surface are symmetrically formed on a dike structure or a groove structure on the substrate and form substantially same bevel angles with the base plane.

14. The magnetic sensor of claim 7, wherein:
the substrate has a first inclined surface, a second inclined surface, and a base plane, the first inclined surface and the second inclined surface being symmetrically disposed with respect to a medial axis of the base plane, and the first inclined surface and the second inclined surface forming substantially same bevel angles with the base plane; and
the magnetic sensor further comprises:
a fifth electrode and a sixth electrode disposed on the first inclined surface;
a seventh electrode and an eighth electrode disposed on the second inclined surface;
a fifth magnetic tunneling junction and a sixth magnetic tunneling junction disposed on the first inclined surface between the fifth electrode and the sixth electrode and connected in parallel between the fifth electrode and the sixth electrode;
the fifth magnetic tunneling junction and the six magnetic tunneling junction being arranged along a third easy axis;
the fifth magnetic tunneling junction including a fifth free layer having a fifth free magnetization and a fifth pinned layer having a fifth pinned magnetization;
the sixth magnetic tunneling junction including a sixth free layer having a sixth free magnetization and a sixth pinned layer having a sixth pinned magnetization;
the fifth and sixth pinned magnetizations each forming an angle of about 45 or 135 degrees with the third easy axis; and
the fifth and sixth free magnetizations being parallel to the third easy axis and in substantially opposite directions; and
a seventh magnetic tunneling junction and an eighth magnetic tunneling junction disposed on the second inclined surface between the seventh electrode and the eighth electrode and connected in parallel between the seventh electrode and the eighth electrode;
the seventh magnetic tunneling junction and the eighth magnetic tunneling junction being arranged along a fourth easy axis;
the seventh magnetic tunneling junction including a seventh free layer having a seventh free magnetization and a seventh pinned layer having a seventh pinned magnetization;
the eighth magnetic tunneling junction including an eighth free layer having an eighth free magnetization and an eighth pinned layer having an eighth pinned magnetization;
the seventh and eighth pinned magnetizations each forming an angle of about 45 or 135 degrees with the fourth easy axis; and
the seventh and eighth free magnetizations being parallel to the fourth easy axis and in substantially opposite directions;
the third easy axis and the fourth easy axis being substantially parallel to the medial axis of the base plane; and
the medial axis forming respective angles of about 45 or 135 degrees with the first easy axis and the second easy axis.

15. The magnetic sensor of claim 14, wherein:
the first and second magnetic tunneling junctions are configured to sense a first magnetic field component that is perpendicular to the first easy axis and parallel to the base plane of the substrate;
the third and fourth magnetic tunneling junctions are configured to sense a second magnetic field component that is perpendicular to the second easy axis and parallel to the base plane of the substrate; and
the fifth, sixth, seventh, and eighth magnetic tunneling junctions are connected in parallel and configured to sense a third magnetic field component that is substantially perpendicular to the base plane of the substrate.

16. The magnetic sensor of claim 14, wherein the angles formed by the first, second, third, fourth, fifth, sixth, seventh, and eighth pinned magnetizations and the respective first, second, third, fourth, fifth, sixth, seventh, and eighth free magnetizations vary by −15% to 15%.

17. A method for forming a magnetic sensor, comprising:
disposing a first magnetic tunneling junction and a second magnetic tunneling junction between a first electrode and a second electrode on a substrate, the first magnetic tunneling junction and the second magnetic tunneling junction being aligned along a first easy axis, the first magnetic tunneling junction including a first pinned layer, a first tunneling layer, and a first free layer, and the second magnetic tunneling junction including a second pinned layer, a second tunneling layer, and a second free layer;
connecting the first magnetic tunneling junction and the second magnetic tunneling junction in parallel between the first electrode and the second electrode;
setting a first pinned magnetization in the first pinned layer of the first magnetic tunneling junction and a second pinned magnetization in the second pinned layer of the second magnetic tunneling junction along a first pinned direction by subjecting the magnetic sensor to one or more external magnetic fields during an annealing process, the first and second pinned magnetizations each forming an angle of about 45 or 135 degrees with the first easy axis; and applying ampere fields to the first free magnetization in the first free layer of the first magnetic tunneling junction and the second free magnetization in the second free layer of the second magnetic tunneling junction by a setting current, the first and second free magnetizations being parallel to the first easy axis and in substantially opposite directions,
wherein the substrate includes a first inclined surface, a second inclined surface, and a base plane,
   the first inclined surface and the second inclined surface being disposed symmetrically with respect to a medial axis of the base plane; and
   the first inclined surface and the second inclined surface forming substantially same bevel angles with the base plane;
the method further comprising:
disposing the first magnetic tunneling junction and the second magnetic tunneling junction on the first inclined surface between the first and second electrodes along the first easy axis;
disposing a third magnetic tunneling junction and a fourth magnetic tunneling junction on the second inclined surface between a third and fourth electrodes along a second easy axis, the third magnetic tunneling junction including a third free layer, a third tunneling layer, and a third pinned layer, and the fourth magnetic tunneling junction including a fourth free layer, a fourth tunneling layer, and a fourth pinned layer;
connecting the first, second, third, and fourth magnetic tunneling junctions in parallel;
setting a third pinned magnetization in the third pinned layer of the third magnetic tunneling junction and a fourth pinned magnetization in the fourth pinned layer of the fourth magnetic tunneling junction along a second pinned direction by subjecting the magnetic sensor to the one or more external magnetic fields during the annealing process, the third and fourth pinned magnetizations each forming an angle of about 45 degrees or 135 degrees with a second easy axis on the second inclined surface; and
setting a third free magnetization in the third free layer of the third magnetic tunneling junction and a fourth free magnetization in the fourth free layer of the fourth magnetic tunneling junction, the third and fourth free magnetizations being parallel to the second easy axis and in substantially opposite directions; and
the first easy axis and the second easy axis are parallel to the medial axis of the base plane.

18. The method of claim 17, further comprising:
disposing a third magnetic tunneling junction and a fourth magnetic tunneling junction between a third electrode and a fourth electrode on the substrate, the third magnetic tunneling junction and the fourth magnetic tunneling junction being aligned along a second easy axis substantially perpendicular to the first easy axis, the third magnetic tunneling junction including a third pinned layer, a third tunneling layer, and a third free layer, and the fourth magnetic tunneling junction including a fourth pinned layer, a fourth tunneling layer, and a fourth free layer;
connecting the third magnetic tunneling junction and the fourth magnetic tunneling junction in parallel between the third and fourth electrodes;
setting a third pinned magnetization in the third pinned layer of the third magnetic tunneling junction and a fourth pinned magnetization in the fourth pinned layer of the fourth magnetic tunneling junction along a second pinned direction by subjecting the magnetic sensor to the one or more external magnetic fields during the annealing process, the third and fourth pinned magnetizations each forming an angle of about 45 or 135 degrees with the second easy axis; and
applying ampere fields to the third free magnetization in the third free layer of the third magnetic tunneling junction and the fourth free magnetization in the fourth free layer of the fourth magnetic tunneling junction by the setting current, the third and fourth free magnetizations being parallel to the second easy axis and in substantially opposite directions.

19. The method of claim 18, wherein a projection of the one or more external magnetic fields on a base plane of the substrate forms an angle of about 45 or 135 degrees with at least one of the first easy axis or the second easy axis.

20. The method of claim 17, further comprising:
setting the first, second, third, and fourth pinned magnetizations by positioning the magnetic sensor with respect to the one or more external magnetic fields.

21. The method of claim 17, further comprising:
generating an external magnetic field for setting the first, second, third, and fourth pinned magnetizations, a first projection of the external magnetic field on the first inclined surface being substantially parallel to the first pinned direction, and a second projection of the external magnetic field on the second inclined surface being substantially parallel to the second pinned direction.

22. The method of claim 17, further comprising:
generating a first external magnetic field parallel to the medial axis of the base plane of the substrate; and
generating a second external magnetic field perpendicular to the base plane of the substrate; and
setting the first, second, third, and fourth pinned magnetizations substantially simultaneously by the first external magnetic field and the second external magnetic field; and
   wherein a first projection of a summary of the first and second external magnetic fields on the first inclined surface is substantially parallel to the first pinned direction, and a second projection of the summary of the first and second external magnetic fields on the second inclined surface is substantially parallel to the second pinned direction.

* * * * *